United States Patent [19]
Djennas et al.

[11] Patent Number: 5,327,008
[45] Date of Patent: Jul. 5, 1994

[54] SEMICONDUCTOR DEVICE HAVING UNIVERSAL LOW-STRESS DIE SUPPORT AND METHOD FOR MAKING THE SAME

[75] Inventors: Frank Djennas; Isaac T. Poku; Robert Yarosh, all of Austin, Tex.

[73] Assignee: Motorola Inc., Schaumburg, Ill.

[21] Appl. No.: 35,422

[22] Filed: Mar. 22, 1993

[51] Int. Cl.$^5$ ............................................. H01L 23/48
[52] U.S. Cl. .................................. 257/666; 257/676; 257/674; 437/220
[58] Field of Search .................. 257/676, 666, 674; 174/52.2, 52.4; 437/220, 217

[56] References Cited

U.S. PATENT DOCUMENTS

| | | | |
|---|---|---|---|
| 4,289,922 | 9/1981 | Devlin | 174/52 |
| 4,612,564 | 9/1986 | Moyer | 357/70 |
| 4,868,635 | 9/1989 | Frechette et al. | 357/70 |
| 4,924,291 | 5/1990 | Lesk et al. | 357/70 |
| 4,994,895 | 2/1991 | Matsuzaki et al. | 357/72 |

FOREIGN PATENT DOCUMENTS

| | | | |
|---|---|---|---|
| 58-66346 | 4/1983 | Japan | 257/676 |
| 2074065 | 3/1990 | Japan | 257/676 |

*Primary Examiner*—William Mintel
*Assistant Examiner*—Roy Potter

[57] ABSTRACT

A semiconductor device (10) includes a lead frame (12) having tie bars (16). In one form of the invention, the tie bars are used to support a semiconductor die (20) to alleviate package cracking problems caused by stress and to provide a universal lead frame which is suitable for use with many different die sizes. In another embodiment, a semiconductor device (45) includes a lead frame (40) having a mini-flag (42) to accomplish these same objectives.

24 Claims, 4 Drawing Sheets

SEMICONDUCTOR DEVICE HAVING UNIVERSAL LOW-STRESS DIE SUPPORT AND METHOD FOR MAKING THE SAME

CROSS-REFERENCE TO RELATED APPLICATION

The present application is related to a commonly assigned, co-pending patent application entitled "Flagless Semiconductor Device and Method for Making the Same," by Tom R. Hollingsworth et al., Ser. No. 08/034,961, filed Mar. 22, 1993.

FIELD OF THE INVENTION

The present invention relates generally to semiconductor devices, and more specifically to semiconductor devices which utilize universal die supports which lower stress in semiconductor packages, and methods for making the same.

BACKGROUND OF THE INVENTION

Package cracking is a common problem in plastic encapsulated semiconductor devices. The problem arises from a combination of factors. One factor is an internal delamination between the plastic encapsulant material and a flag of a lead frame. The flag is a plate-like member of a conventional lead frame which supports the die. The flag, like the rest of the lead frame, is usually made of copper, a copper-alloy, or an iron-nickel alloy, and therefore has a coefficient of thermal expansion (CTE) which in most instances is different than that of the surrounding molding compound or plastic. As a result of this CTE mismatch, stress is created at the plastic-flag interface as the semiconductor device experiences temperature changes. The stress, upon reaching a maximum threshold, is relieved through delamination of the plastic-flag interface. Another factor involved in package cracking is moisture absorption. After the plastic-flag interface becomes delaminated, moisture from the environment diffuses through the molding compound to the delaminated area. Once moisture accumulates in the package, rapid temperature increases will cause the moisture to vaporize and expand, thereby creating an internal pressure pocket in the delaminated area. To relieve the pressure and associated stress, the surrounding plastic cracks. The most common occurrence of package cracking occurs when a user attaches a plastic semiconductor device to a substrate using a solder reflow operation. The rapid increase and high temperatures associated with solder reflow are often sufficient, depending on the moisture content of the device, to cause the plastic to crack.

There are numerous existing methods of dealing with the problem of package cracking. One method is dry-packing, which involves baking plastic encapsulated semiconductor devices sufficiently to reduce moisture content and packaging the devices into moisture resistant packets. Device users then attach the device before a sufficient amount of moisture to cause cracking can be absorbed into the package through exposure to ambient conditions. This method is effective, but significantly increases the costs of semiconductor devices. Moreover, device users must keep track of how long devices have been exposed to the ambient conditions to assure that any absorbed moisture is insufficient to cause cracking problems.

Other known approaches have tried to decrease the possibility of internal delamination through improved adhesion between flag and the plastic. For example, some manufacturers have "roughened" the metallic surface of the flag to improve adhesion. Others have formed small holes or dimples in the flag to provide anchoring mechanisms. Another approach used to improve adhesion is use of a window-frame flag. A window-frame flag is more or less a hollowed-frame that supports the die, rather than a solid paddle.

The methods described above do, to some extent, decrease the possibility of delamination by providing better adhesion to the plastic encapsulating material. Similarly, the present invention has the advantage of reduced delamination, albeit through a technique not previously used. But in addition, the present invention addresses another manufacturing problem which the above methods do not address, namely the need for semiconductor manufacturers to use a different or customized lead frame design for each of its products. Having a different lead frame design for each die size and die functional pin-out necessitates a large inventory of piece-parts and requires additional time and human resources to design a new lead frame before each product introduction. In addition to costs associated with inventory and design, the cost of the lead frames themselves are undesirably inflated because of insufficient volume to lower the cost to a minimum. Several small orders for lead frames, each requiring separate tooling, is more costly than one order for the same total number of lead frames. Thus, the cost of semiconductor manufacturing could be significantly reduced by the use of a lead frame design which could be used in conjunction with several different die sizes. The present invention achieves this goal by utilizing a lead frame in a semiconductor device which can be used with various die sizes, while at the same time improving adhesion between the lead frame and the encapsulating material to alleviate package cracking problems.

SUMMARY OF THE INVENTION

In one form of the present invention, a semiconductor device has a plurality leads which define a die receiving area and a tie bar which traverses the die receiving. A semiconductor die is mount on, and supported by, the tie bar in the die receiving area. The die is electrically coupled to the plurality of leads and is encapsulated in a package body. In another form of the invention, a mini-flag is integrated into the tie bar such that the mini-flag and tie bar together support the die. Also within the scope of the invention are methods for making these semiconductor devices.

These and other features of the present invention will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF THE PREFERRED EMBODIMENT

Figure 1:
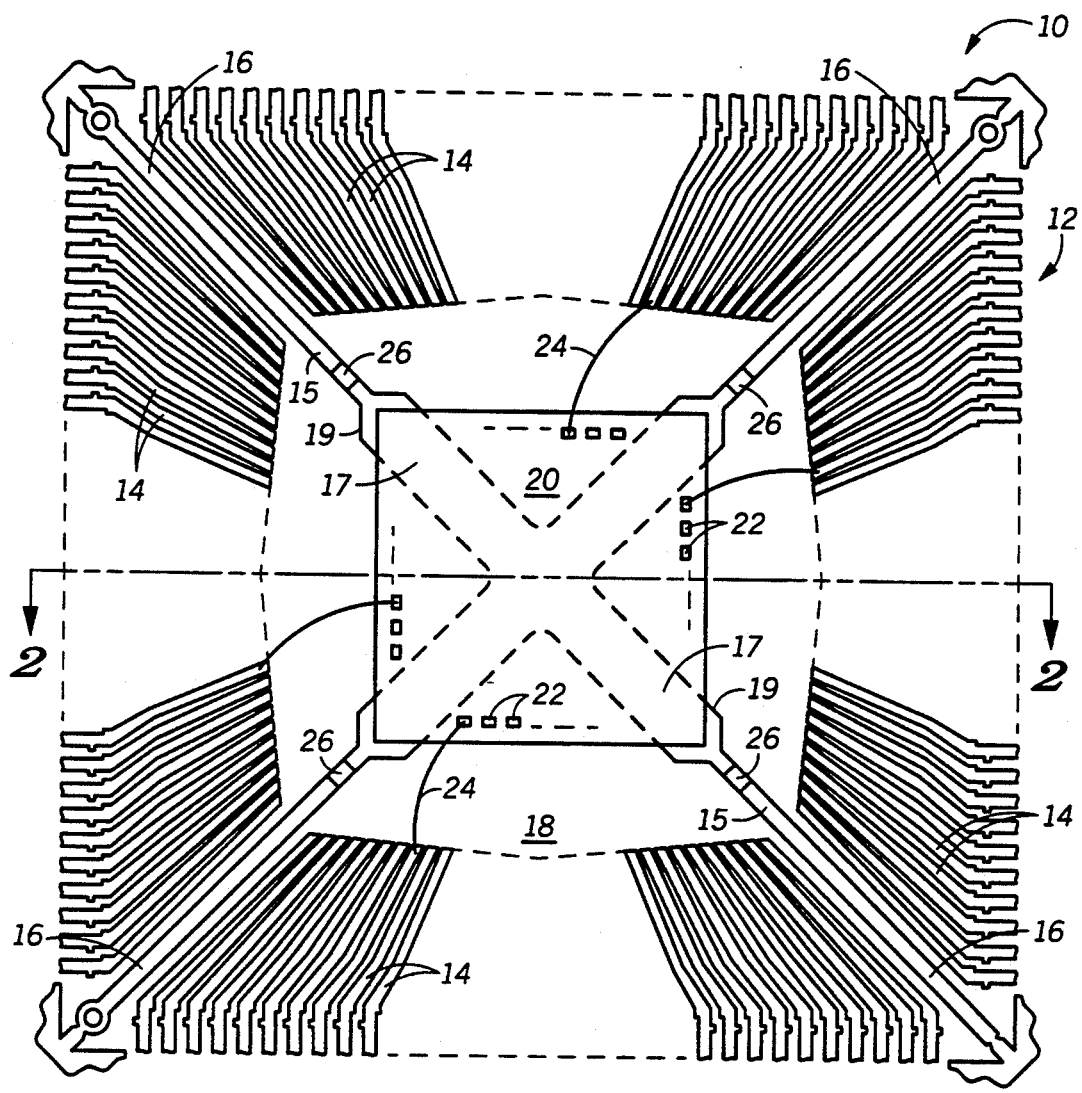
FIG. 1 is a top-down plan view of portions of an unpackaged, flagless semiconductor device in accordance with the present invention.

The present invention combines the attributes of a universal lead frame, that is one that is usable with several different die sizes, with the advantage of reduced delamination between the lead frame and an encapsulating material. Thus, the present invention alleviates the problem of package cracking. FIG. 1 illustrates these advantages in a top-down plan view of one embodiment of the present invention. A semiconductor device 10 has portions of a lead frame 12 which include a plurality of leads 14 and four tie bars 16. Lead frame 12 of FIG. 1 is only partially illustrated. As one of ordinary skill in the art would understand, leads 14 and tie bars 16 extend to two opposing rails (not illustrated) as in a conventional strip lead frame. In addition, not all of the leads of lead frame 12 are illustrated. But for the purposes of understanding the present invention, the remaining portions need not be illustrated. The plurality of leads 14 each have inner lead portions which together define a die receiving area 18 within the device. The particular lead frame illustrated in FIG. 1 is for use in a QFP (quad flat pack) semiconductor package; however, it is important to realize the present invention is not limited to such a package type, as will become evident later in the description. In the QFP design, each tie bar 16 originates at a corner of device 10 and extends into die receiving area 18 until converging with the other tie bars to form an "X". In one alternative embodiment, tie bars 16 could extend from opposing sides of the die receiving area to form a "+" as viewed from the perspective of FIG. 1.

Figure 2:
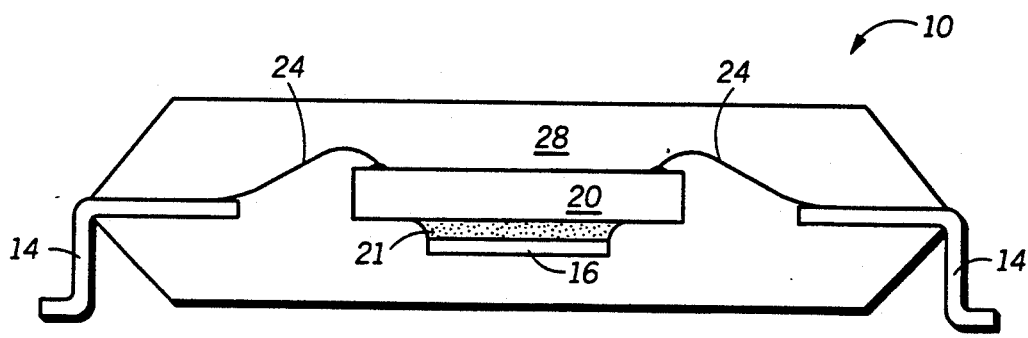
FIG. 2 is a cross-sectional view of the semiconductor device of FIG. 1 taken along the line 2—2, as packaged in plastic.

Mounted onto tie bars 16 is a semiconductor die 20. A conventional die attach adhesive 21, illustrated in a cross-sectional view of device 10 in FIG. 2, is used to mount die 20 to tie bars 16. Die 20 is typically an integrated circuit, such as a microprocessor, a memory, an analog device, or the like, which is fabricated on silicon or another semiconducting substrate. Die 20 includes a plurality of conductive bond pads 22 used to electrically access portions of the integrated circuit through various conducting layers (not shown) of the die. The electrical accessibility to the circuit is extended externally through a combination of conventional wire bonds 24 and leads 14. Wire bonds 24 electrically couple bonds pads 22 to respectively leads 14. As depicted in FIG. 2, leads 14 extend outside of a package body 28 to provide external accessibility to the end device user.

In accordance with one embodiment of the invention, tie bars 16 each have two distinct portions with different widths. A first portion 15 having a first width extends from the rails (not shown) into die receiving area 18. A second portion 17 actually supports die 20. Portions 17 each have a second width which is larger than the first width. The reason for the two different widths is not that die 20 cannot be supported by a narrower tie bar. As will become evident in FIG. 3, it is the configuration of the tie bars, not the width, that establishes adequate die support strength and stability. Instead, the reason two tie bar portions having different widths is used is to establish "shoulders" 19. Shoulders 19 provide a reference point used to align die 20 on the tie bars. Vision-based die bonding equipment can easily locate shoulders 19, thereby enabling accurate placement of die 20 onto the tie bars. As illustrated, each shoulder 19 is approximately parallel with a side of die 20. Features other than shoulders 19 can be used to aid in die mounting, as will also become evident in FIG. 3. It is important to note, however, that use of such die alignment features is not an essential aspect of the present invention.

FIG. 1 demonstrates the universal aspect of device 10. Due to the configuration of tie bars 16 of lead frame 12, several different semiconductor die sizes and shapes can be used. Conventional devices typically employ lead frames having a flag, onto which a semiconductor die is mounted. The flag is made slightly larger than the die to provide a large die bonding area, thereby maximizing the adhesion between the die and the flag. In using such a flag, a semiconductor manufacture restricts which die can be used in the device. Thus for different die shapes and sizes, the manufacture must design a new lead frame. As discussed previously, new designs delay product introductions and add to manufacturing costs.

A device in accordance with the present invention eliminates many new lead frame designs in comparison to traditional methods. As illustrated in FIG. 1, device 10 does not employ a flag. Instead, die 20 rests on tie bars 16. Due to the configuration of tie bars 16, nearly any size or shape of die can be supported. A limitation to the die size and shape of die 20 is imposed by inner portions of leads 14 which define die receiving area 18. Another limitation to the die size used with lead frame 12 may be wire bond length. As the die size becomes smaller, the length of wire bonds 24 needed to electrically couple the die to leads 14 increases. Thus, a manufacturer's upper limit on wire bond length will also set a lower limit on die size.

Further limitations to die size can be imposed by features in the tie bars. For instance, if shoulders 19 or other alignment features are used, mounting a die on the tie bars which covers the alignment features may defeat their initial purpose. However, use of shoulders or other alignment features does not prohibit variable dies sizes from being used. Although the distance from an alignment feature to the die may vary with different die sizes, several different die sizes can still be used with the same lead frame design. For example, die sizes smaller than die 20 can still be mounted onto tie bars 16. Another tie bar feature which limits die size may be down-set regions, such as down-set regions 26 illustrated in FIG. 1. Portions 15 of the tie bars are approximately planar with leads 14, whereas portions 17 are in a lower plane as a result of down-set regions 26. The down-set feature is also illustrated in FIG. 2, a cross-sectional view of device 10, as packaged, taken along the line 2—2 of FIG. 1. Down-set tie bars are used to lower the position of the die in comparison to leads to facilitate wire bonding. If tie bars 16 are designed to include down-set regions, the size of die 20 is further limited to an area within the down-set region to avoid mounting the die on noncoplanar tie bars.

The cross-section of FIG. 2 aids in understanding how device 10 is also more resistant to package delamination when compared to devices which use conventional lead frames and flags. Device 10 as illustrated in FIG. 2 is packaged in a plastic resin package body 28. Package body 28 is formed about the device using traditional plastic encapsulation methods. But unlike traditional plastic packages, package body 28 is less prone to cracking because die 20 is supported by tie bars 16. (In FIG. 2 it appears that only one tie bar supports the die because the cross-section is taken where all the tie bars converge to one point.) The reason why package body 28 is less prone to cracking is because the total interface area between the plastic package material and the die support (in this case, tie bars 16) is much less than the interface area in conventional devices. For the purposes of this discussion, the interface between the die support member and the plastic is referred to as the plastic-metal interface rather than the plastic-flag interface since not all embodiments of the present invention have a flag. In conventional devices which employ a flag, the plastic-metal interface within the die receiving area is equal to the area of the flag, which is slightly more than the area of the die. In device 10, on the other hand, the plastic-metal interface area is considerably less, being equal to the surface area of the tie bars.

The improvement in package cracking performance in device 10 and other embodiments of the present invention is attributable to improved adhesion properties. As discussed previously, delamination traditionally occurs between a flag and the plastic packaging material because of high stress and poor adhesion between the lead frame metals and conventional plastic encapsulation materials. The present invention improves the delamination problem by minimizing the plastic-metal interface area, thereby minimizing the potential delamination area. Decreasing the interface area between the lead frame and plastic results in an increase in the interface area between the plastic packaging and the backside of the semiconductor die, herein referred to as the plastic-die interface. The increase in the plastic-die interface area is advantageous because adhesion between plastic encapsulation materials and silicon (the most common semiconductor die material) is stronger than the adhesion between plastic and most lead frame metals. Accordingly, delamination is less likely to occur at the plastic-die interface than at the plastic-metal interface.

Figure 3:
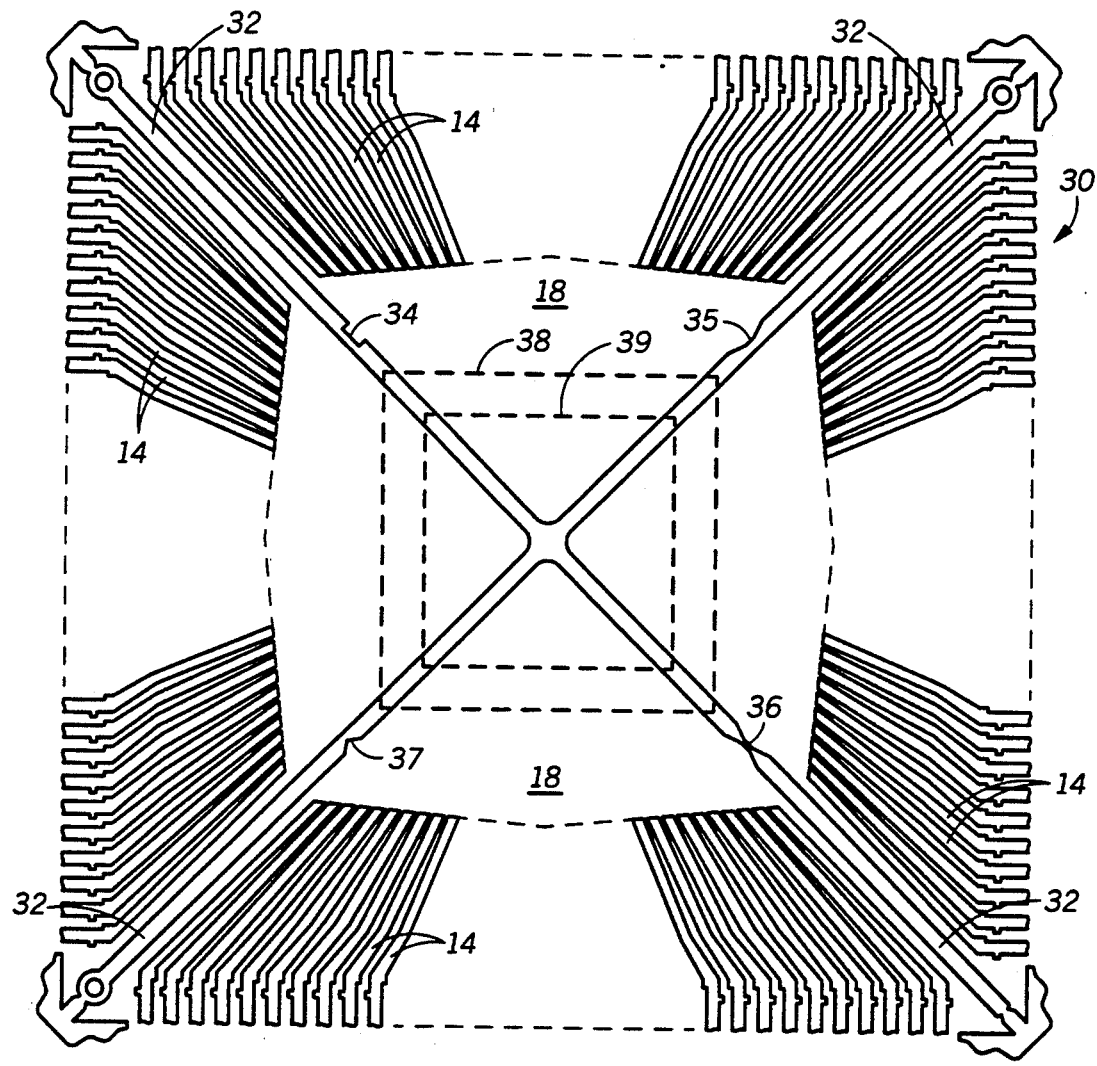
FIG. 3 is a top-down plan view of portions of an alternative lead frame design suitable for use in the present invention.

FIG. 3 illustrates portions of a lead frame 30 in a top-down plan view. Lead frame 30 has various features which can be used in a semiconductor device in accordance with the present invention. Similarly, lead frame 30 has many features in common with lead frame 12 of FIG. 1. Accordingly, like numerals in each of the figures represent the same or similar elements. Four tie bars 32 of lead frame 30 extend across die receiving area 18 to form an X-shaped die support (a semiconductor die is not illustrated in FIG. 3). Unlike tie bars 16 in FIG. 1, each tie bar 32 has a substantially constant width throughout die receiving area 18. An advantage in using tie bars 32 over tie bars 16 is that with tie bars 32 there is a smaller plastic-metal interface area, thereby lowering the chances of delamination and package cracking. One the other hand, tie bars 32 do not have shoulders to aid in die alignment. However, other features can be incorporated into tie bars 32 to assist in die mounting. A few of the possible types of features suited for this are illustrated in FIG. 3 as alignment features 34, 35, 36, and 37. An alignment feature is included in each of tie bars 32 to represent various types of alignment features which might be implemented. However, it is important to note that any number of tie bars can incorporate any number or type of alignment feature. FIG. 3 also illustrates the universal nature of lead frame 30, showing that two different die sizes (represented in phantom as lines 38 and 39) can be used in conjunction with the same lead frame.

Figure 4:
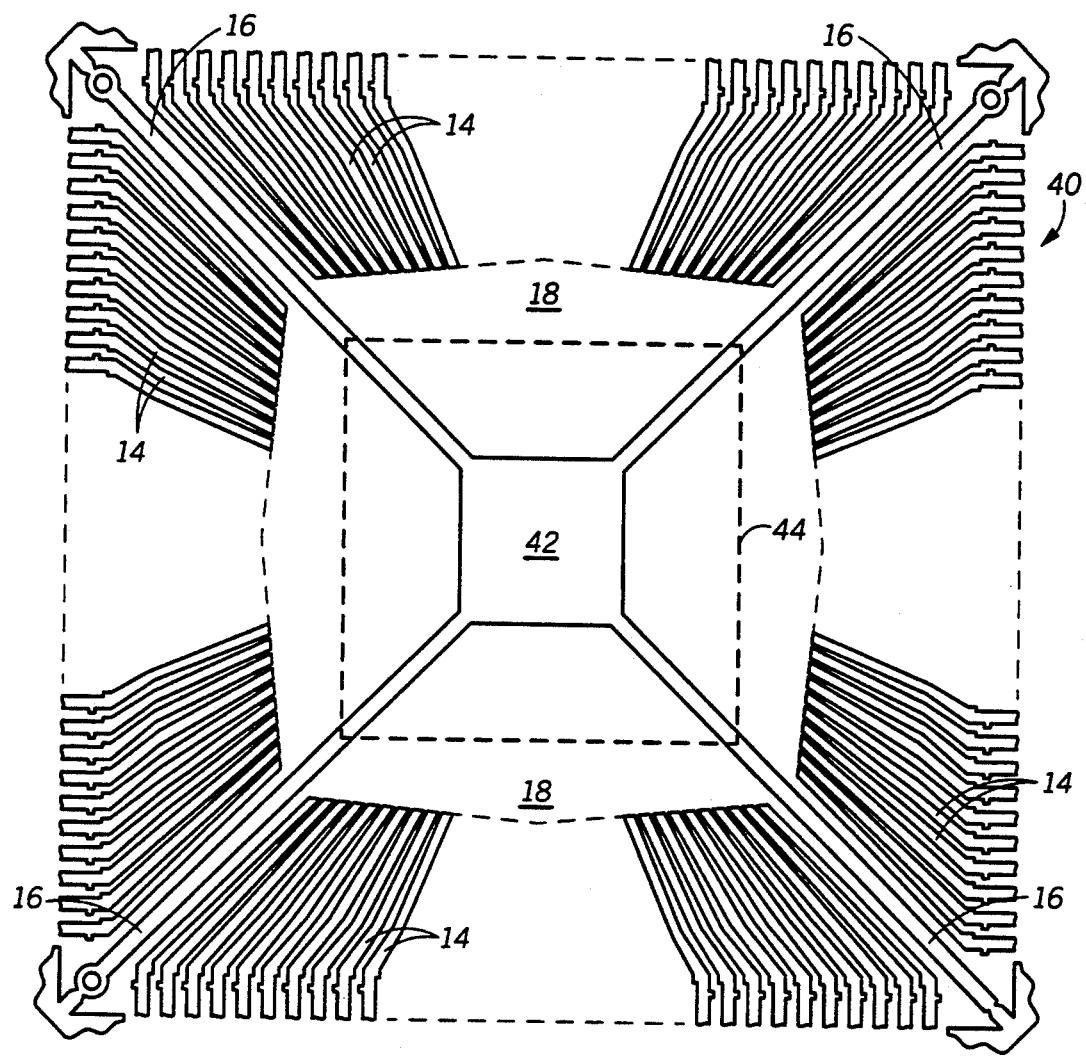
FIG. 4 is a top-down plan view of portions of yet another lead frame design for use in one embodiment of the present invention which utilizes a mini-flag.
Figure 5:
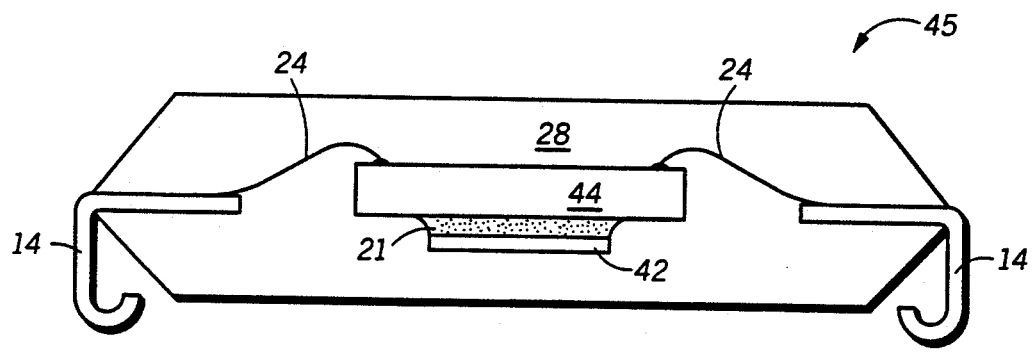
FIG. 5 is a cross-sectional view a packaged semiconductor device in accordance with the present invention which utilizes the lead frame of FIG. 4.

For additional die support and die attach area in a semiconductor device of the present invention, a "mini-flag" can be incorporated into the tie bars. FIG. 4 illustrates, in a top-down plan view, portions of a lead frame 40 having such a mini-flag 42. Mini-flag 42 is kept smaller in area than a semiconductor die (illustrated in phantom as line 44) to keep the total interface area between the mini-flag and a plastic encapsulation material (not illustrated) smaller than in conventional devices. The actual size of the mini-flag can be optimized to meet processing and reliability requirements of a particular manufacturer. As a general rule, however, the area of mini-flag 42 should be less than 50 percent of the area of a semiconductor die mounted thereto. But, the comparative area of the mini-flag and die specified may be met for some semiconductor die and not for others. In deciding how large or how small to make mini-flag 42, it is important to keep in mind that as the size of mini-flag increases, the plastic-metal interface area increases and consequently the possibility of delamination and package cracking increases. FIG. 5 is a cross-sectional view of lead frame 40 incorporated into a semiconductor device 45 in accordance with the present invention. Other elements of device 45 are similar to or are the same as other elements discussed in reference to previous embodiments and are thus labeled with the same reference numerals.

Figure 6:
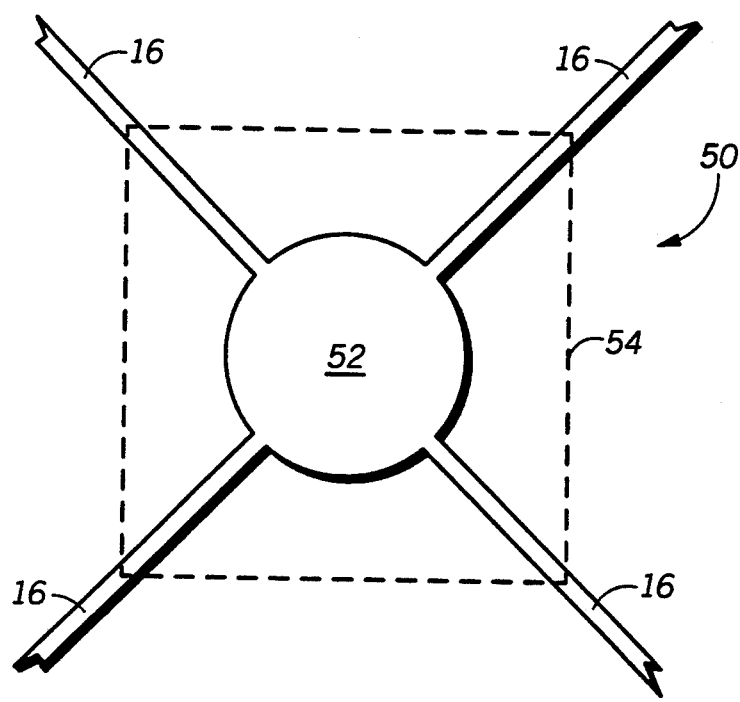
FIG. 6 is a top-down view of portions of an alternative lead frame design having a mini-flag, also suited for use in accordance with the present invention.

Use of a mini-flag still maintains the universal nature of a semiconductor device in accordance with the present invention since a number of different die sizes can be used with the same lead frame. A semiconductor device using a mini-flag in accordance with the present invention removes previous constraints on flag size, and also on flag shape. For instance, as illustrated in FIG. 6, portions of a lead frame 50 (only partially illustrated) can include a round mini-flag 52 to support a larger die (illustrated in phantom as line 54).

Figure 7:
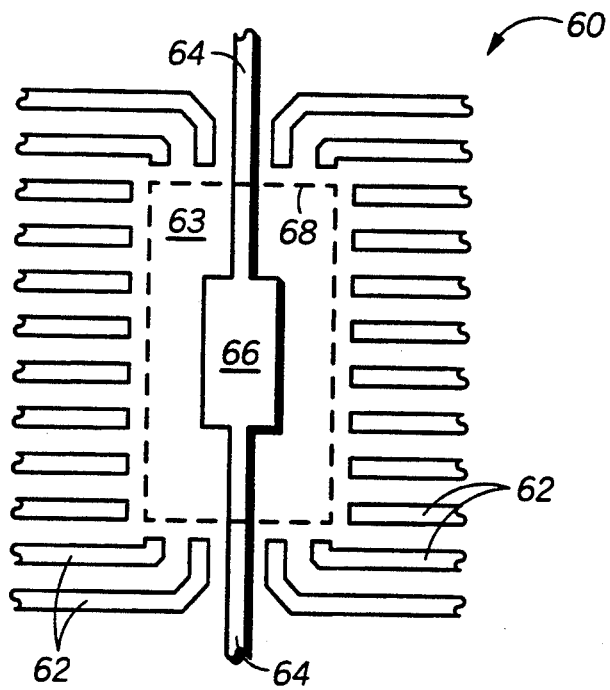
FIG. 7 is a top-down view of portions of yet another lead frame design having a mini-flag suited for use with the present invention.

Use of a mini-flag can also be used in conjunction with semiconductor devices which employ less than four tie bars, for example as demonstrated in FIG. 7. A lead frame 60 (only partially illustrated) has a plurality of leads 62, the inner portions of which define a die receiving area 63. Extending across die receiving area 63 are two tie bars 64. Lead frames which include two tie bars extending from opposing sides of the die receiving area are most commonly used in PDIP (plastic dual-in-line) devices. Like in previous lead frame illustrations, not all portions of the lead frame 60 are illustrated. For instance, one of ordinary skill in the art would realize that the tie bars and leads extend to rails of a lead frame strip, but neither the entire stripe nor the rails are illustrated. Incorporated into tie bars 64 is a mini-flag 66 which is made to have an area smaller than the area of a semiconductor die mounted thereto (illustrated in phantom as line 68). Use of a mini-flag allows several different die sizes to be mounted onto mini-flag 66 without having to redesign the entire lead frame, thereby saving manufacturing costs. Like other embodiments of the present invention, the reduced area of mini-flag 66 results in a smaller plastic-metal interface, in comparison to conventional devices, once the lead frame is encapsulated by plastic. Thus, delamination and package cracking problems are less likely.

In practicing the present invention it may be necessary to modify existing semiconductor device assembly procedures. One likely modification is the need to change a print pattern for applying die attach adhesive (e.g. adhesive 21 in FIGS. 2 and 5) to die support members of a lead frame. In using a traditional lead frame with a flag larger than the semiconductor, an adhesive material is usually applied in a predetermined pattern through a dispense head onto the flag. In practicing the present invention, the die attach adhesive pattern is now limited to, for example in device 10 of FIG. 1, the tie bar portions 17 beneath the die. Therefore, tooling modifications for adhesive dispense heads may be necessary. Also, the amount of die attach adhesive dispensed is reduced since the die support area is smaller. Tighter process control may also be needed for a couple of reasons. Since the die overhangs die support member (either tie bars or a mini-flag), it is important that the die attach adhesive not spread beyond the die support member when attaching a semiconductor die to prevent the adhesive from contaminating the tooling platform. Another reason to control the amount of die attach adhesive is to provide the proper fillet. In conventional semiconductor device, a fillet of die attach adhesive is formed around the periphery of the semiconductor die. In the present invention, the fillet surrounds the periphery of the die support member. A suitable fillet for a die attach adhesive used in accordance with the present invention is illustrated in FIGS. 2 and 5.

Another processing modification may be useful during wire bonding. Since a semiconductor die is not fully supported along the die periphery, it may be advantageous to provide peripheral die support during wire bonding. Bond pads are generally, but not always, located around the periphery of the die. Thus, to bond a wire to each bond pad, a wire bonding tool must exert pressure on the die perimeter each time it forms a bond. If the wire bonding force is high enough, or alternatively if the die is not flexible enough, there is a risk that the force exerted will cause an unsupported portion of the die to crack or chip. Therefore, it may be desirable to incorporate a support mechanism into the wire bonding platform. For instance, the platform may be designed to include a cut-out which matches the pattern and thickness of the tie bars (and if included the mini-flag) so together the platform and tie bars (and if included the mini-flag) form a substantially planar and continuous surface. As a result the entire die would be supported by a combination of the tie bars and platform during the wire bonding operation. A further advantage of having the die supported by a planar and continuous surface is to achieve even heating of the die during the wire bonding operation. It is important to note that modifications to existing wire bonding operations may not be needed in practicing the present invention. The need for modifications will depend on various factors, including bonding force, die thickness, die size, and bond pad location to name a few.

The foregoing description and illustrations contained herein demonstrate many of the advantages associated with the present invention. In particular, it has been revealed that delamination and package cracking in semiconductor devices can be abated through minimizing internal plastic-metal interfaces. This is accomplished in accordance with the present invention by either eliminating a conventional flag altogether and using tie bars to support a semiconductor die, or alternatively by using a mini-flag which is smaller in area than the die. By reducing the possibility of package cracking, semiconductor manufacturers can move away from expensive dry-packing procedures. Moreover, the present invention helps to solve a manufacturing problem associated with die-specific lead frame design. The die support members used in devices of the present invention will support die of various sizes, such that a new lead frame need not be designed for each type of die. Thus, manufacturing costs, including design and inventory costs, are reduced.

It is therefore apparent that there has been provided, in accordance with the invention, a semiconductor device having a universal, low stress die support, and method for making the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, tie bars which are used to support a semiconductor die need not be in an "X" configuration. Any configuration which will adequately support a die is contemplated as being suitable. In addition, the invention is not limited to any particular number of tie bars to support a die. There is confusion in terminology as to the number of tie bars a particular device has. For instance in FIG. 7, one might say lead frame 60 has one tie bar. To avoid confusion, the number of tie bars recited with respect to the present description refers to the number of places the tie bars are connected to rails of the lead frame. This is analogous to the number of places in which a tie bar is excised from a lead frame, to become flush with an edge or side of a package body. Thus for purposes herein, there are two tie bars in lead frame 60, regardless of the presence of mini-flag 66, because the tie bars connect with rails (not illustrated) in two places. In any event, the number of tie bars used is not as important as the nature of the tie bar configuration. For example, in a preferred embodiment, the tie bar(s) form a die support member which is continuous across the entire die receiving area. In using a mini-flag in accordance with the present invention, the mini-flag can be modified using any of several known methods to also improve package cracking performance. For instance, the mini-flag can include dimples or small holes to improve adhesion. Furthermore, a mini-flag can be a window-frame mini-flag. It is also important to note that the present invention is also adaptable to semiconductor devices employing a die-down configuration. In other words, a die may be mounted to tie bars (or a mini-flag) such that the active surface of the die is adjacent the die support. Such adaptations are within the scope of the present invention. In addition, the present invention is not limited by any type of external lead configuration (e.g. J-lead, gull-wing, or through-hole) of package configuration (e.g. QFP, PDIP, etc.). Nor is the present invention limited to any particular type of encapsulating material, lead frame material, or method for electrically coupling a semiconductor device to leads. Therefore, it is intended that this invention encompass all such variations and modifications as fall within the scope of the appended claims.

What is claimed is:

1. A semiconductor device comprising:
   a lead frame comprising:
   a plurality of leads having inner lead portions and outer lead portions, wherein the inner lead portions define a die receiving area having a central region;
   a plurality of tie bars traversing the die receiving area and being interconnected near the central region thereof, each tie bar having a width;
   a semiconductor die mounted on and supported by the one or more tie bars in the die receiving area, the die have a diagonal distance which is more than four times the tie bar width;
   means for electrically coupling the semiconductor die to the inner portions of the leads; and
   a package body encapsulating the semiconductor die and inner lead portions of the plurality of leads;
   wherein the plurality of tie bars is the only portion of the lead frame supporting the semiconductor die.

2. The semiconductor device of claim 1 wherein the plurality of tie bars forms a die support member which is continuous within the die receiving area.

3. The semiconductor device of claim 1 wherein the plurality of tie bars comprises a plurality of tie bars which traverse the die receiving area and intersect to form an X-shaped die support member.

4. The semiconductor device of claim 3 wherein the width of each tie bar is a first width of a first portion of the tie bar, wherein each tie bar has a second portion having a second width greater than the first width, wherein both the first and second widths are less than one-quarter of the diagonal distance, and wherein the semiconductor die is mounted on the second portions of the plurality of tie bars.

5. The semiconductor device of claim 4 wherein the semiconductor die has a plurality of sides, wherein each tie bar has a shoulder which separates the first and second portions, and wherein each shoulder is approximately parallel to a side of the semiconductor die.

6. The device of claim 1 wherein the width of each tie bar is on the order of 0.20–0.65 millimeters.

7. The device of claim 6 wherein the width of the tie bar, which is on the order of 0.20–0.65 millimeters, is a maximum width of each tie bar within the package body.

8. A semiconductor device comprising:
   a plurality of leads, each having an inner lead portion and an outer lead portion, the inner lead portions together defining a die receiving area;
   a substantially X-shaped die support member located within the die receiving area, wherein the die support member has four converging arms, each arm having a width;
   a semiconductor die mounted on the arms of the X-shaped die support member, the die having a diagonal distance more than four times the width of the die support member arms;
   means for electrically coupling the semiconductor die to the plurality of leads; and
   a package which encapsulates the semiconductor die and inner lead portions of the plurality of leads.

9. The semiconductor device of claim 6 wherein the die receiving area is a substantially quadrilateral shape having corners and a center, and wherein the die support member comprises at least two tie bars extending from corners of the die receiving area and converging at the center, thereby forming the X-shaped die support member.

10. The semiconductor device of claim 9 wherein the package has four sides and wherein outer lead portions of the plurality of leads extend from each of the four sides of the package.

11. The semiconductor device of claim 6 wherein the width of each arm is a first width of a first portion of each arm, wherein each arm has a second portion of a second width greater than the first width, and wherein the semiconductor die is mounted on the second portions of the arms of the die support member.

12. The semiconductor device of claim 11 wherein the semiconductor die has a plurality of sides, wherein the die support member has a plurality of shoulders which separate the first and second portions of the legs, and wherein each shoulder is approximately parallel to a side of the semiconductor die.

13. The device of claim 8 wherein the width of each arm of the X-shaped die support member is on the order of 0.20–0.65 millimeters.

14. The device of claim 13 wherein the width of each arm, which is on the order of 0.20–0.65 millimeters, is a maximum width of each arm supporting the semiconductor die.

15. A semiconductor device comprising:
    a lead frame comprising:
    a plurality of leads having inner lead portions and outer lead portions, wherein the inner lead portions define a die receiving area having a central region;
    a plurality of tie bars traversing the die receiving area;
    a mini-flag interconnect with the plurality of tie bars to form a continuous die support member, wherein the mini-flag is located in the central regions of the die receiving area and has a first area and a first perimeter;
    a semiconductor die mounted on and supported by the mini-flag, wherein the die has a second area at least twice the first area and a second perimeter larger than the first perimeter, such that the die covers all portions of the mini-flag;
    means for electrically coupling the semiconductor die to the plurality of leads; and
    a package body encapsulating the semiconductor die and inner lead portions of the plurality of leads;
    wherein the plurality of tie bars and mini-flag are the only members of the lead frame supporting the semiconductor die.

16. The semiconductor device of claim 15 wherein the semiconductor die has a quadrilateral shape and the mini-flag has a quadrilateral shape substantially similar to, but smaller than, the shape of the semiconductor die.

17. The semiconductor device of claim 15 wherein the die receiving area has opposing sides and a center, and wherein the plurality of tie bars comprises two tie bars which extend from opposing sides of the die receiving area and converge in the central region, and wherein the mini-flag is interconnected to the tie bars at the convergence of the two tie bars.

18. The semiconductor device of claim 15 wherein the die receiving area has corners, and wherein the plurality of tie bars comprises a plurality of tie bars extending from the corners of the die receiving area and intersecting to form a substantially X-shaped die support member, and wherein the mini-flag is integrated into the intersection of the plurality of tie bars.

19. A method for making a semiconductor device comprising the steps of:
   providing a lead frame having a plurality of leads, each lead having an inner lead portion and an outer lead portion, wherein the inner lead portions together define a die receiving area having a central region, the lead frame further having a plurality of tie bars traversing the die receiving area and being interconnected near the central region, wherein each tie bar has a width;
   providing a semiconductor die, the die having a diagonal distance more than four times the tie bar width;
   applying a die attach adhesive to a portion of each of the tie bars;
   mounting the semiconductor die to the portions of tie bars having die attach adhesive applied thereto, such that only the plurality of tie bars of the lead frame is supporting the die;
   electrically coupling the semiconductor die to the inner lead portions of the plurality of leads; and
   encapsulating the semiconductor die, inner lead portions of the plurality of leads and a portion of the tie bar to form a package body.

20. The method of claim 19 wherein the step of providing a lead frame comprises providing a lead frame having a plurality of tie bars which converge to form an X-shaped die support member.

21. The method of claim 19 wherein the width of each tie bar is on the order of 0.20-0.65 millimeters.

22. The method of claim 21 wherein the width of the tie bar, which is on the order of 0.20-0.65 millimeters, is a maximum width of each tie bar within the package body.

23. A method for making a semiconductor device comprising the steps of:
   providing a lead frame having a plurality of leads, each lead having an inner lead portion and an outer lead portion, wherein the inner lead portions together define a die receiving area having a center, the lead frame further having a plurality of tie bars traversing the die receiving area and a mini-flag having a first area and interconnected with the plurality of tie bars near the center of the die receiving area;
   providing a semiconductor die having a second area at least twice the first area;
   applying a die attach adhesive to the mini-flag;
   mounting the semiconductor die to the mini-flag such that the die covers all portions of the mini-flag and portions of the plurality of tie bars and such that only the mini-flag and the portions of the tie bar support the die;
   electrically coupling the semiconductor die to the inner lead portions of the plurality of leads; and
   encapsulating the semiconductor die, inner lead portions of the plurality of leads and a portion of the tie bar to form a package body.

24. The method of claim 23 wherein the step of applying a die attach adhesive to the mini-flag further comprises applying the die attach adhesive to portions of each of the tie bars which are to be covered by the semiconductor die.

* * * * *

UNITED STATES PATENT AND TRADEMARK OFFICE
CERTIFICATE OF CORRECTION

PATENT NO. : 5,327,008
DATED : July 5, 1994
INVENTOR(S) : Frank Djennas, Isaac T. Poku, and Robert Yarosh It is certified that error appears in the above-indentified patent and that said Letters Patent is hereby corrected as shown below:

In claim 9, line 1 (col. 9, line 65) change "claim 6" to --claim 8--.
In claim 11, line 1 (col. 10, line 8) change "claim 6" to --claim 8--.
In claim 12, line 4 (col. 10, line 17) change the word "legs" to --arms--.

Signed and Sealed this

Third Day of September, 1996

Attest:

BRUCE LEHMAN

Attesting Officer     Commissioner of Patents and Trademarks